United States Patent
Huang

(10) Patent No.: US 7,705,669 B2
(45) Date of Patent: Apr. 27, 2010

(54) PREAMPLIFIER AND METHOD FOR CALIBRATING OFFSETS THEREIN

(75) Inventor: Chih-Haur Huang, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 53 days.

(21) Appl. No.: 12/149,650

(22) Filed: May 6, 2008

(65) Prior Publication Data

US 2009/0278601 A1    Nov. 12, 2009

(51) Int. Cl.
*H03F 1/02* (2006.01)
(52) U.S. Cl. .......................................... 330/9; 330/253
(58) Field of Classification Search ................ 330/9, 330/69, 252–261; 327/124, 307
See application file for complete search history.

(56) References Cited

U.S. PATENT DOCUMENTS 7,088,174 B2 *   8/2006   Glass ............................. 330/9
7,560,991 B2 *   7/2009   Lin et al. ..................... 330/292

OTHER PUBLICATIONS

Introduction to LVD's, PECL, and CML; Application Note: HFAN-1.0 (Rev. 1, Apr. 2008); Maxim Integrated Products; pp. 1-14 (Some parts of this application note first appeared in Electronic Engineering Times on Jul. 3, 2000, Issue 1120).

* cited by examiner

*Primary Examiner*—Robert Pascal
*Assistant Examiner*—Khiem D Nguyen
(74) *Attorney, Agent, or Firm*—Rabin & Berdo, P.C.

(57) ABSTRACT

A preamplifier includes cascade-connected amplifying circuits, and at least one of the cascade-connected amplifying circuits includes a differential switch pair circuit, a comparator and energy storing elements. The differential switch pair circuit has a pair of differential inputs and a pair of differential outputs. The comparator outputs a comparison signal by comparing the differential outputs. The energy storing elements are respectively and selectively coupled to one of the differential outputs based on the comparison signal to adjust potential of the differential outputs. A method for calibrating offsets in a preamplifier is also disclosed herein.

15 Claims, 4 Drawing Sheets

PREAMPLIFIER AND METHOD FOR CALIBRATING OFFSETS THEREIN

BACKGROUND

1. Field of Invention

The present invention relates to an amplifying circuit in a receiver. More particularly, the present invention relates to a preamplifier and method for calibrating offsets therein in a receiver.

2. Description of Related Art

For a conventional preamplifier in a receiver, there are usually a number of stages of cascade-connected amplifying circuits in the preamplifier. Small differential signals are input into the preamplifier and sequentially amplified by the cascade-connected amplifying circuits to be the large differential signals. However, each of the amplifying circuits in the preamplifier often has more or less offsets in itself, such that the amplified differential signals output by the amplifying circuit may have different common voltage levels therebetween.

As a result, the large differential signals output from the preamplifier may have the problem of duty cycle distortion, and the skew tolerance of the receiver could be thus decreased.

SUMMARY

In accordance with one embodiment of the present invention, a preamplifier is provided. The preamplifier includes a plurality of cascade-connected amplifying circuits, and at least one of the cascade-connected amplifying circuits includes a differential switch pair circuit, a comparator and a plurality of energy storing elements. The differential switch pair circuit has a pair of differential inputs and a pair of differential outputs. The comparator outputs a comparison signal by comparing the differential outputs. The energy storing elements are respectively and selectively coupled to one of the differential outputs based on the comparison signal to adjust potential of the differential outputs.

In accordance with another embodiment of the present invention, a method for calibrating offsets in a preamplifier is provided. The method includes the steps of: comparing with each other a pair of differential outputs of a differential switch pair circuit of at least one of cascade-connected amplifying circuits in the preamplifier to output a comparison signal; and coupling respectively and selectively a plurality of energy storing elements to one of the differential outputs based on the comparison signal to adjust potential of the differential outputs.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
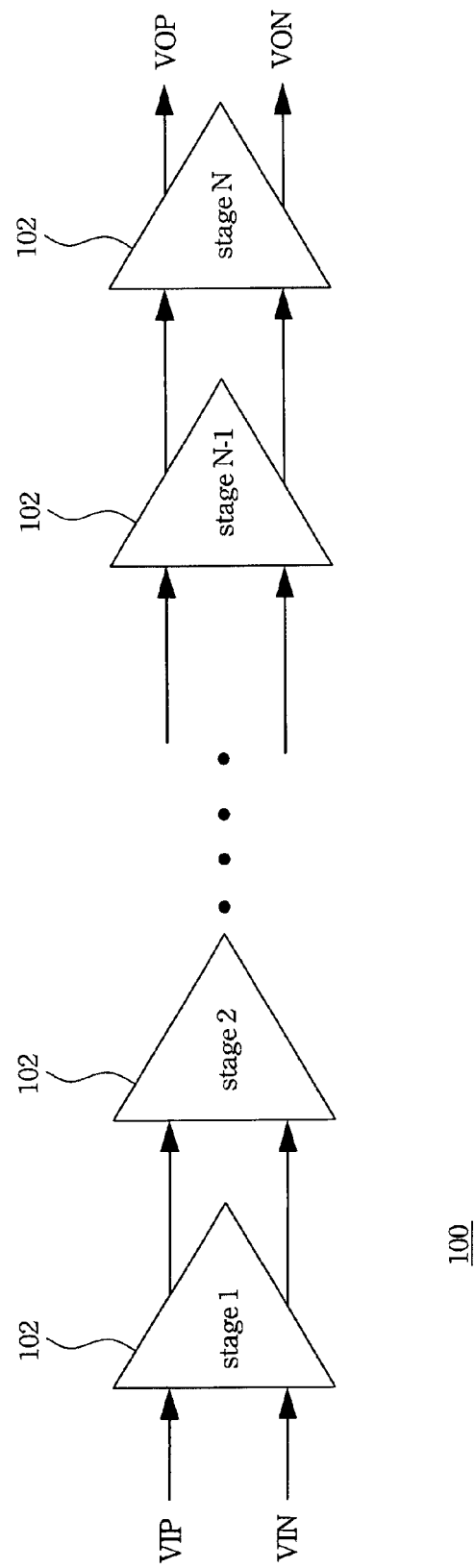
FIG. 1 illustrates a preamplifier according to one embodiment of the present invention.

FIG. 1 illustrates a preamplifier according to one embodiment of the present invention. The preamplifier 100 includes a number (e.g. N) of stages of cascade-connected amplifying circuits 102, in which each of the amplifying circuits 102 can be a current mode logic (CML) circuit. Small differential signals VIP and VIN are input into the $1^{st}$ stage of the amplifying circuits 102 and sequentially amplified by the cascade-connected amplifying circuits 102. After that, the amplified differential signals VOP and VON are output from the $N^{th}$ stage of the amplifying circuits 102.

Figure 2:
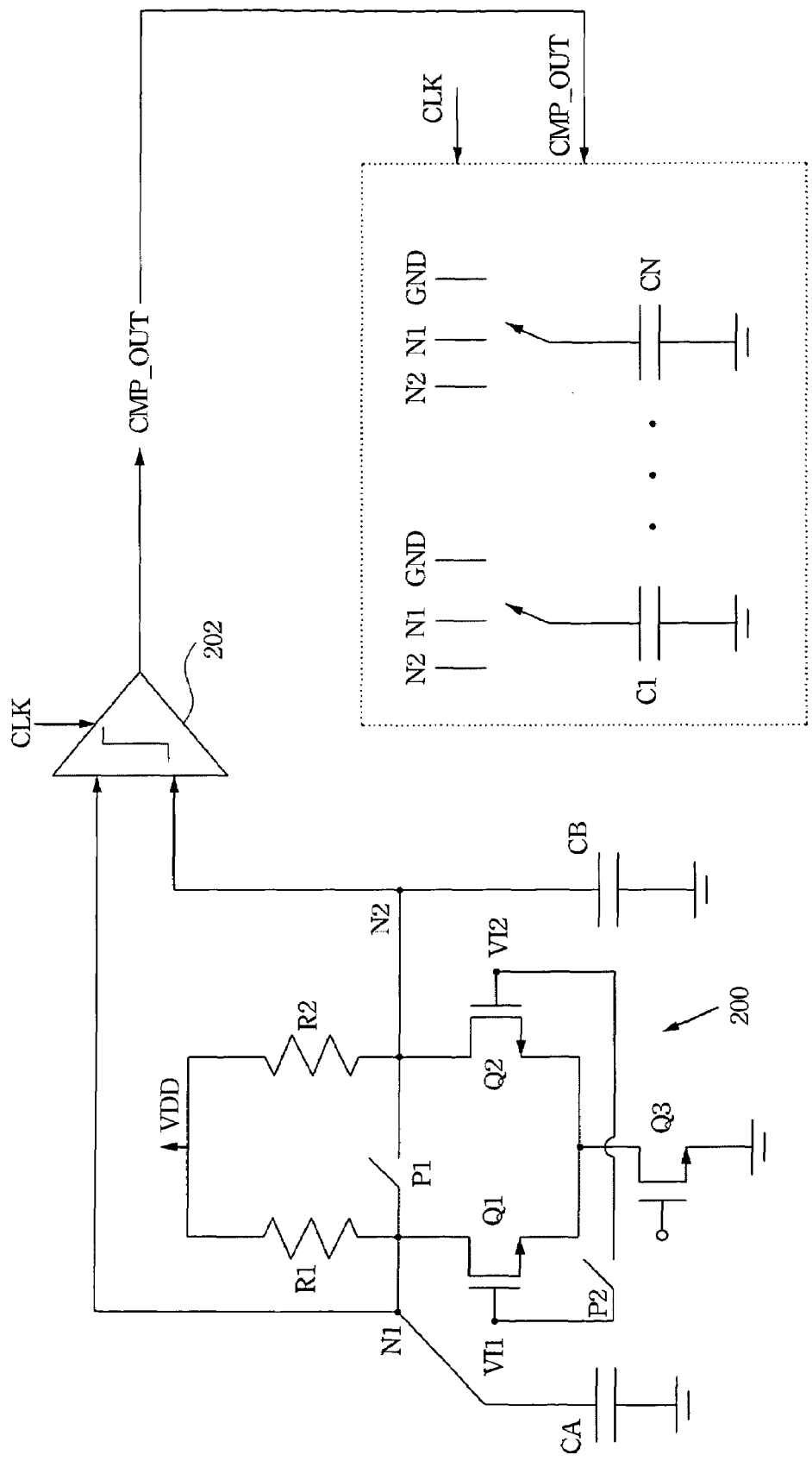
FIG. 2 illustrates one of the amplifying circuits shown in FIG. 1 according to one embodiment of the present invention.

FIG. 2 illustrates the circuit in one of the amplifying circuits shown in FIG. 1 according to one embodiment of the present invention. It is noticed that at least one of the amplifying circuits 102 shown in FIG. 1 can include the same circuit as shown in FIG. 2. In one embodiment, the $1^{st}$ stage of the amplifying circuits 102 includes the same circuit as shown in FIG. 2.

The amplifying circuit 102 includes a differential switch pair circuit 200 (including transistors Q1, Q2, Q3 and resistors R1, R2), a comparator 202, a number of energy storing elements (e.g. capacitors C1, C2, . . . , and CN), a first switch P1, a second switch P2, and a pair of reference energy storing elements (e.g. capacitors CA and CB). The differential switch pair circuit 200 has a pair of differential inputs (i.e. VI1 and VI2) and a pair of differential outputs (i.e. N1 and N2). The comparator 202 outputs a comparison signal CMP_OUT by comparing the differential outputs N1 and N2. The capacitors C1, C2, . . . , and CN are coupled to a ground terminal at an initial state, and are respectively and selectively coupled to one of the differential outputs N1 and N2 based on the comparison signal CMP_OUT to adjust potential of the differential outputs N1 and N2. The capacitances of the capacitors C1, C2, . . . , and CN can be all the same, partially the same or even different from one another, based on the requirement in practice. The switch P1 is coupled between the differential outputs N1 and N2 and short-circuits the differential outputs N1 and N2 when turned on. The switch P2 is coupled between the differential inputs VI1 and VI2 and short-circuits the differential inputs VI1 and VI2 when turned on. The capacitors CA and CB are coupled to the differential outputs N1 and N2, respectively.

The following describes the offset calibration in the preamplifier according to one embodiment of the present invention. First, if the switch P1 is turned on such that the differential outputs N1 and N2 are short-circuited, the comparator 202 outputs the comparison signal CMP_OUT according to a self-offset of the comparator 202. At the moment, the capacitors C1, C2, and CN are respectively and selectively coupled to one of the differential outputs N1 and N2 based on the comparison signal CMP_OUT, so as to adjust the potential of the differential outputs N1 and N2 and to calibrate the self-offset of the comparator 202 accordingly.

After that, if the switch P1 is turned off and the switch P2 is turned on, such that the differential inputs VI1 and VI2 are short-circuited, the comparator 202 outputs the comparison-signal CMP_OUT according to the offset between the differential outputs N1 and N2. At the moment, the capacitors C1, C2, ..., and CN are respectively and selectively coupled to one of the differential outputs N1 and N2 based on the comparison signal CMP_OUT, so as to adjust the potential of the differential outputs N1 and N2 once again and to calibrate the offset between the differential outputs N1 and N2 accordingly. For example, if the potential of the differential output N1 is larger than the potential of the differential output N2, a few of the capacitors C1, C2, ..., and CN are respectively and selectively changed to couple to the differential output N1 based on the comparison signal CMP_OUT. Therefore, from the following equation:

$$CA \times V(N1) + CB \times V(N2) = (CA + C1 + \ldots) \times V(N1^*) + CB \times V(N2)$$

the adjusted potential of differential output N1 (i.e. N1*) is smaller than the original potential. In other words, the potential of the differential output N1 changes according to the number of the capacitors coupled to the differential output N1.

Thereafter, if the switches P1 and P2 both are turned off, the differential signals are input into the differential inputs VI1 and VI2. Since the potential of the differential outputs N1 and N2 have been adjusted in the foregoing steps, the amplified differential signals output from the differential outputs N1 and N2 have no offset therebetween.

Figure 3:
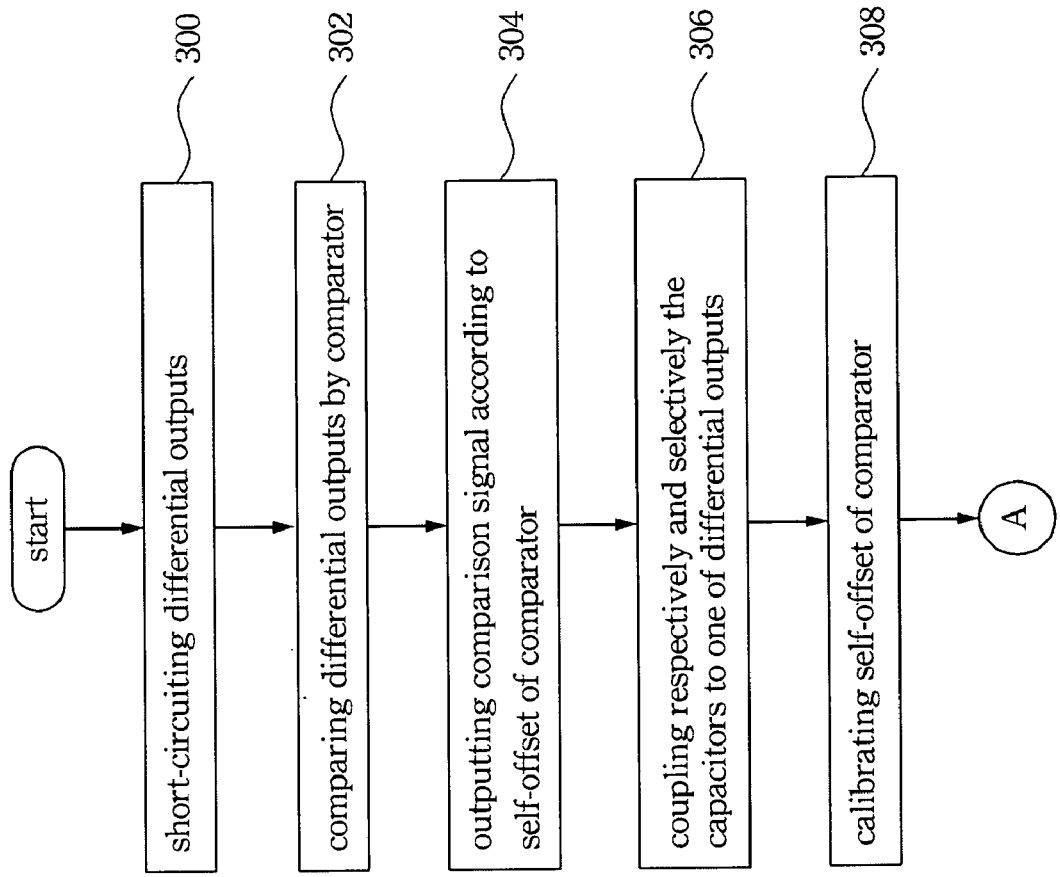
FIG. 3 and FIG. 4 illustrate a flow chart of a method for calibrating offsets in a preamplifier according to one embodiment of the present invention.
Figure 4:
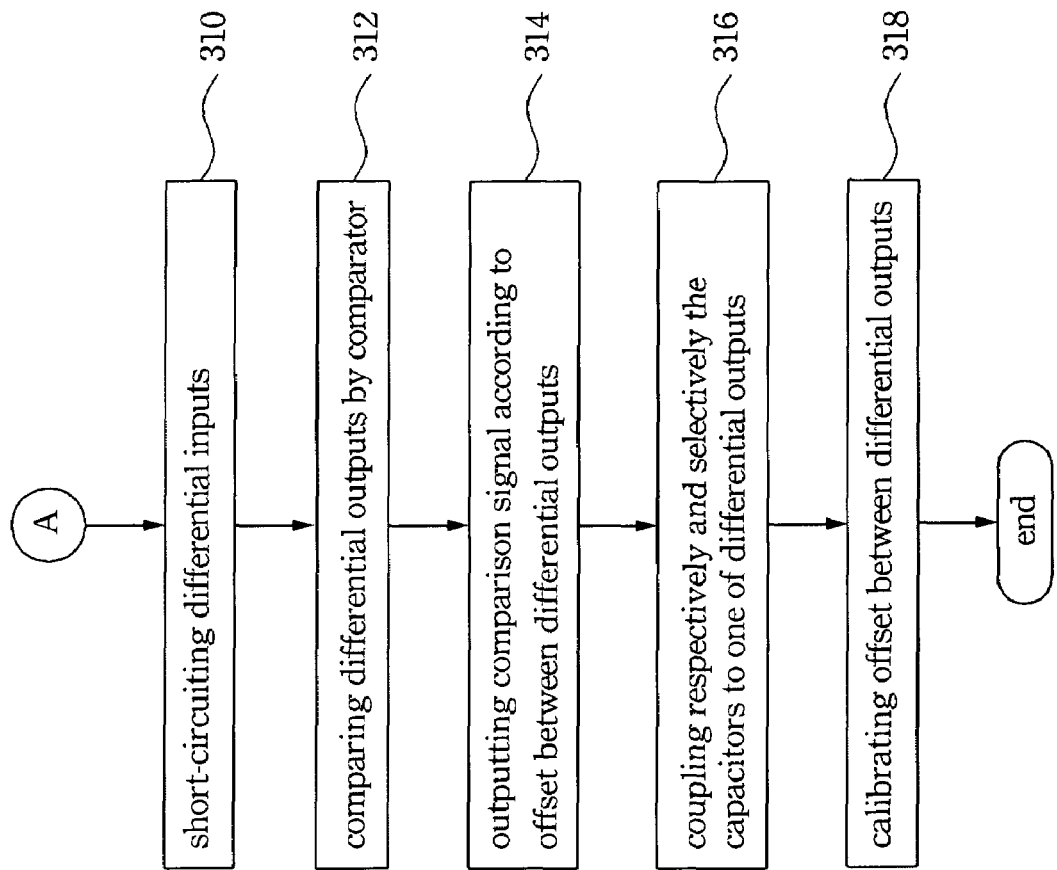

FIG. 3 and FIG. 4 illustrate a flow chart of a method for calibrating offsets in a preamplifier according to one embodiment of the present invention. Refer to FIG. 2, FIG. 3 and FIG. 4. First, the differential outputs N1 and N2 are short-circuited (Step 300). Then, the differential outputs N1 and N2 are compared with each other by the comparator 202 (Step 302). After that, the comparison signal CMP_OUT is output by the comparator 202 according to the self-offset of the comparator 202 (Step 304). Thereafter, the capacitors C1, C2, ..., and CN, which are coupled to the ground terminal at the initial state, are respectively and selectively coupled to one of the differential outputs N1 and N2 based on the comparison signal CMP_OUT (Step 306), so as to adjust the potential of the differential outputs N1 and N2. Then, the self-offset of the comparator 202 is calibrated by respectively and selectively coupling the capacitors C1, C2, ..., and CN to one of the differential outputs N1 and N2 (Step 308).

Furthermore, the capacitors CA and CB can be coupled to the differential outputs N1 and N2, respectively, such that the initial potential of the differential outputs N1 and N2 can be stored in the capacitors CA and CB, respectively.

Next, the differential inputs VI1 and VI2 are short-circuited (Step 310). Then, the differential outputs N1 and N2 are compared with each other by the comparator 202 once again (Step 312). After that, the comparison signal CMP_OUT is output by the comparator 202 according to the offset between the differential outputs N1 and N2 (Step 314). Thereafter, the capacitors C1, C2, ..., and CN are respectively and selectively coupled to one of the differential outputs N1 and N2 based on the comparison signal CMP_OUT once again (Step 316), so as to re-adjust the potential of the differential outputs N1 and N2. Then, the offset between the differential outputs N1 and N2 is calibrated by respectively and selectively coupling the capacitors C1, C2, ..., and CN to one of the differential outputs N1 and N2 (Step 318). As a result, the amplified differential signals output from the differential outputs N1 and N2 have no offset therebetween.

For the foregoing embodiments, the preamplifier and method for calibrating offsets therein can be provided to reduce the offsets in the preamplifier, such that the amplified differential signals output by the preamplifier have the same common voltage level therebetween, so as to solve the problem of the duty cycle distortion and the decreased skew tolerance of the receiver.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A preamplifier, comprising:
   a plurality of cascade-connected amplifying circuits, at least one of the cascade-connected amplifying circuits comprising:
   a differential switch pair circuit having a pair of differential inputs and a pair of differential outputs;
   a comparator outputting a comparison signal by comparing the differential outputs; and
   a plurality of energy storing elements respectively and selectively coupled to one of the differential outputs based on the comparison signal to adjust potential of the differential outputs, wherein the energy storing elements are coupled to a ground terminal at an initial state.

2. The preamplifier as claimed in claim 1, further comprising:
   a first switch coupled between the differential outputs and short-circuiting the differential outputs when turned on.

3. The preamplifier as claimed in claim 2, wherein when the differential outputs are short-circuited, the comparator outputs the comparison signal according to a self-offset of the comparator.

4. The preamplifier as claimed in claim 3, wherein the energy storing elements are respectively and selectively coupled to one of the differential outputs based on the comparison signal to calibrate the self-offset of the comparator.

5. The preamplifier as claimed in claim 1, further comprising:
   a second switch coupled between the differential inputs and short-circuiting the differential inputs when turned on.

6. The preamplifier as claimed in claim 5, wherein when the differential inputs are short-circuited, the comparator outputs the comparison signal according to an offset between the differential outputs.

7. The preamplifier as claimed in claim 6, wherein the energy storing elements are respectively and selectively coupled to one of the differential outputs based on the comparison signal to calibrate the offset between the differential outputs.

8. The preamplifier as claimed in claim 1, further comprising:
   a pair of reference energy storing elements coupled to the differential outputs respectively.

9. The preamplifier as claimed in claim 1, wherein each of the amplifying circuits is a current mode logic (CML) circuit.

10. The preamplifier as claimed in claim 1, wherein each of the energy storing elements is a capacitor.

11. A method for calibrating offsets in a preamplifier, the method comprising the steps of:
    comparing with each other a pair of differential outputs of a differential switch pair circuit of at least one of cascade-connected amplifying circuits in the preamplifier to output a comparison signal;

coupling respectively and selectively a plurality of energy storing elements to one of the differential outputs based on the comparison signal to adjust potential of the differential outputs; and coupling the energy storing elements to a ground terminal at an initial state.

12. The method as claimed in claim 11, wherein the step of comparing the differential outputs with each other is carried out by a comparator.

13. The method as claimed in claim 12, further comprising the steps of:

short-circuiting the differential outputs;

outputting the comparison signal according to a self-offset of the comparator; and calibrating the self-offset of the comparator by coupling respectively and selectively the energy storing elements to one of the differential outputs.

14. The method as claimed in claim 11, further comprising the steps of:

short-circuiting a pair of differential inputs of the differential switch pair circuit;

outputting the comparison signal according to an offset between the differential outputs; and calibrating the offset between the differential outputs by coupling respectively and selectively the energy storing elements to one of the differential outputs.

15. The method as claimed in claim 11, further comprising the step of:

coupling a pair of reference energy storing elements to the differential outputs respectively.

* * * * *